United States Patent [19]

Choi et al.

[11] Patent Number: 5,751,045

[45] Date of Patent: May 12, 1998

[54] NAND TYPE NON-VOLATILE MEMORY DEVICE

[75] Inventors: Jung-dal Choi; Sung-bu Jun; Byeung-chul Kim, all of Kyungki-do, Rep. of Korea

[73] Assignee: Samsung Electronics Co., Ltd., Kyungki-do, Rep. of Korea

[21] Appl. No.: 604,301

[22] Filed: Feb. 21, 1996

[30] Foreign Application Priority Data

Apr. 11, 1995 [KR] Rep. of Korea ............... 95-8400

[51] Int. Cl.$^6$ .................. H01L 29/76; H01L 29/94; H01L 31/062; H01L 31/113
[52] U.S. Cl. .................. 257/392; 257/391; 257/403
[58] Field of Search .................. 257/390, 391, 257/392, 403

[56] References Cited

U.S. PATENT DOCUMENTS

| | | | |
|---|---|---|---|
| 4,889,820 | 12/1989 | Mori | 437/29 |
| 5,081,052 | 1/1992 | Kobayashi et al. | 437/29 |
| 5,245,207 | 9/1993 | Mikoshiba et al. | 257/392 |
| 5,600,171 | 2/1997 | Makihara et al. | 257/390 |
| 5,610,092 | 3/1997 | Tasaka | 437/48 |

*Primary Examiner*—Ngân V. Ngô
*Attorney, Agent, or Firm*—Cushman Darby & Cushman IP Group of Pillsbury Madison & Sutro LLP

[57] ABSTRACT

In a NAND type non-volatile memory device, an ion-implanting region is formed only in the source/drain region (or only in the drain region) of a depletion-type transistor for string selection, so that its junction depth is greater than that of the other transistors, to thereby improve the current-driving capability of each memory element.

4 Claims, 7 Drawing Sheets

NAND TYPE NON-VOLATILE MEMORY DEVICE

BACKGROUND OF THE INVENTION

The present invention relates to a NAND type non-volatile semiconductor memory device, and more particularly, to a programmable NAND type non-volatile memory device into which data can be electrically written for semi-permanent storage.

With the ongoing increase in demand for custom-purpose integrated circuits, research on an individually programmable mask ROM is being actively pursued. Here, though the cell structure of such a mask ROM may be either NOR type or NAND type, recently, the NAND type is mainly used due to its benefits in high integration.

Generally, as disclosed in U.S. Pat. No. 4,142,176, the NAND type mask ROM has a cell structure in which a plurality of depletion type transistors and a plurality of enhancement type transistors are serially connected through a diffusion layer. A series of cells serially connected between a bit line and a ground line are defined as one string.

FIG. 1 shows a partial equivalence circuit of a conventional NAND type mask ROM, which includes one or more string selection transistors serially connected to the bit line and n MOS transistors serially connected between a source side of the string selection transistors and the ground line to thereby operate as a memory cell, where n is typically 8, 16 or 32.

The operation of such a NAND type mask ROM will now be explained with reference to FIG. 1. In the case of reading out a specific memory cell $C_1$, controlled by a first word line $WL_1$, first, Vcc voltage is applied to a first string selection line SSL1 to turn on the enhancement type transistor for string selection and 0V is applied to an adjacent second string selection line SSL2, to thereby select a string including the specific memory cell $C_1$. The Vcc voltage is also applied to the remaining word lines (those not selected) to turn on all non-selected cells, with 0V being applied to the selected word line $WL_1$.

Here, the data stored in selected memory cell $C_1$ is read by shutting off the current path to ground so that the bit-line voltage goes high or by providing a ground path (bit line voltage goes low), depending on whether the cell transistor is the enhancement type or depletion type.

Here, between two serially connected transistors for string selection, the enhancement type transistor acts as a switch for selectively transferring a read voltage applied to the bit line to a memory cell and the depletion type transistor serves to unilaterally pass the read voltage applied to the bit line to the memory cell.

FIG. 2 is a plan view of the NAND type mask ROM according to FIG. 1, and FIG. 3 is a cross-sectional view taken along line a—a' of FIG. 2. Here, reference numbers 10, 20, 30, 40 and 50 denote an active region used as the source/drain of a transistor, an ion-implanting region required to have a depletion type channel, polysilicon used as signal connecting means inside a chip and a gate electrode of the transistor, a contact hole and wiring metal, respectively. In the cross sectional structure, each memory cell and string selection transistor has a lightly doped drain (LDD) structure and the junction depths of sources and drains of all transistors inside the string are uniform.

In a fully described mask ROM, however, as integration increases or operation voltage decreases, the current driving capability of transistors for string selection and memory cells decreases and junction capacitance increases, which more heavily loads the bit line and slows read operations. Especially, due to a decrease of the current driving capability of the depletion type transistor for string selection, which is operated as a passive element for transferring bit line voltage, reducing the operating voltage while maintaining high integration of the mask ROM represents a significant design obstacle.

While the LDD structure reduces bulk current in a drain junction to improve reliability of the transistor, due to the increase of snapback voltage because of the decreased electric field in the drain junction, at the time of discharging electro static discharge (ESD) current, high joule heat is generated to lower ESD destruction voltage.

SUMMARY OF THE INVENTION

It is an object of the present invention to provide a NAND type non-volatile memory capable of improving current driving capability.

To accomplish the above object, there is provided a NAND type non-volatile memory comprising a serial circuit with a plurality of cells for data memory comprised of serially connected depletion type and enhancement type transistors and a plurality of serially connected depletion type and enhancement type transistors for string selection in order to select one specific cell among the cells. In the present invention, an ion-implanting region is formed in the source and drain regions of the depletion type transistors for string selection and the junction depth of the source and drain regions of the depletion type transistors is greater than those of the sources and drains of other transistors.

According to another embodiment of the present invention, an ion-implanting region is formed only in a drain region of the depletion type transistor for string selection, and the junction depth of the drain region of this transistor is greater than those of the sources and drains of other transistors.

According to the present invention, the ion-implanting region is formed without increasing the number of masks, thereby improving the current driving capability of a NAND type mask ROM.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
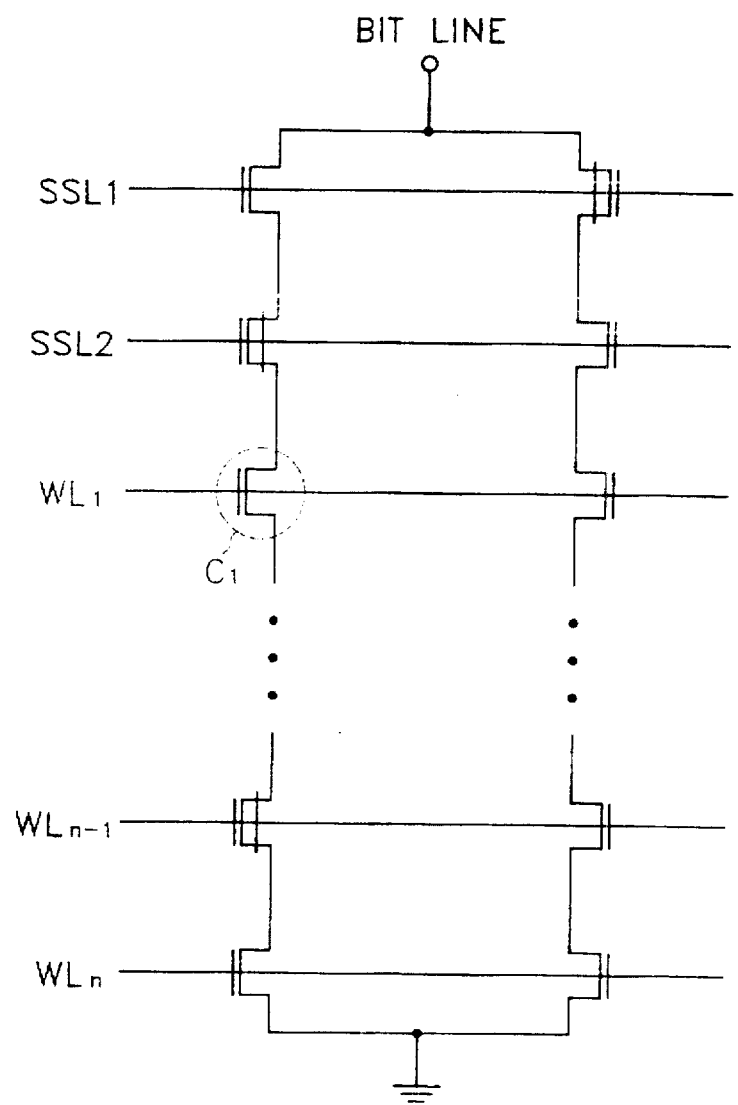
FIG. 1 is a partial equivalence circuit of a conventional NAND type non-volatile memory device.
Figure 2:
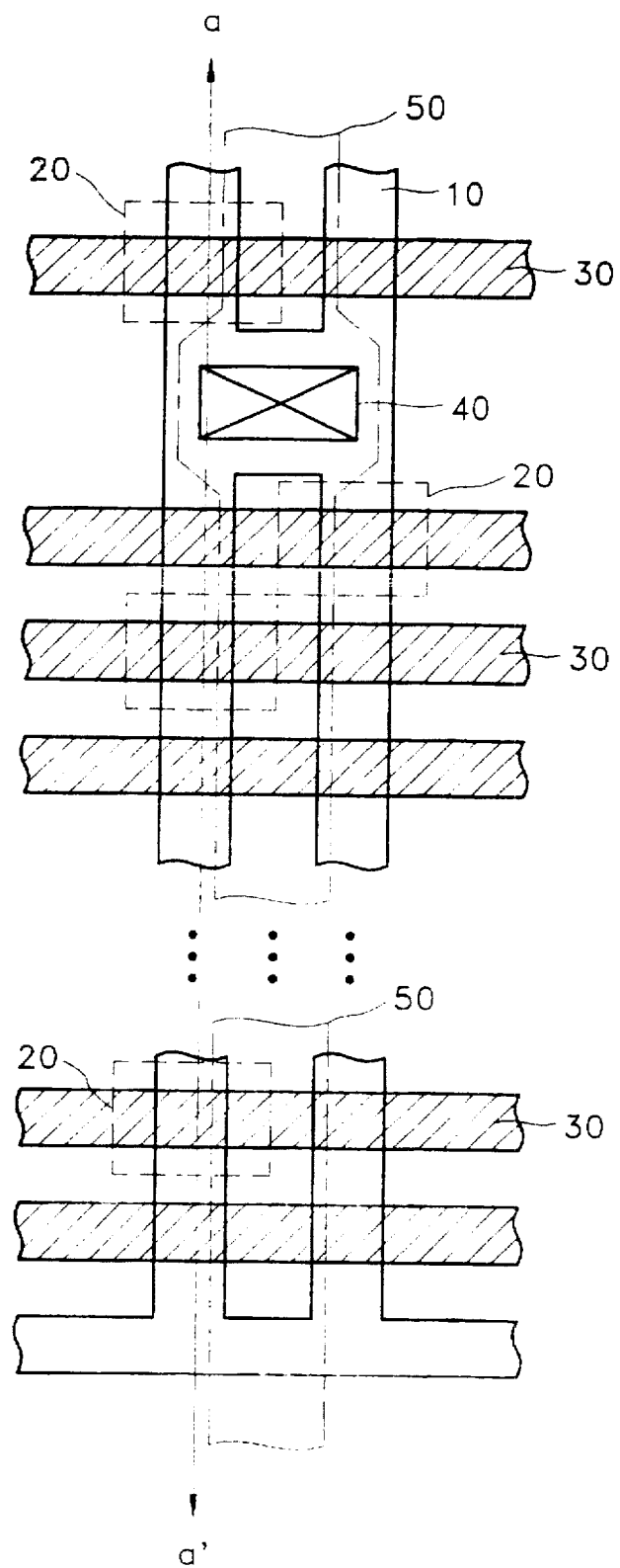
FIG. 2 is a plan view of the NAND type non-volatile memory device of FIG. 1.
Figure 3:
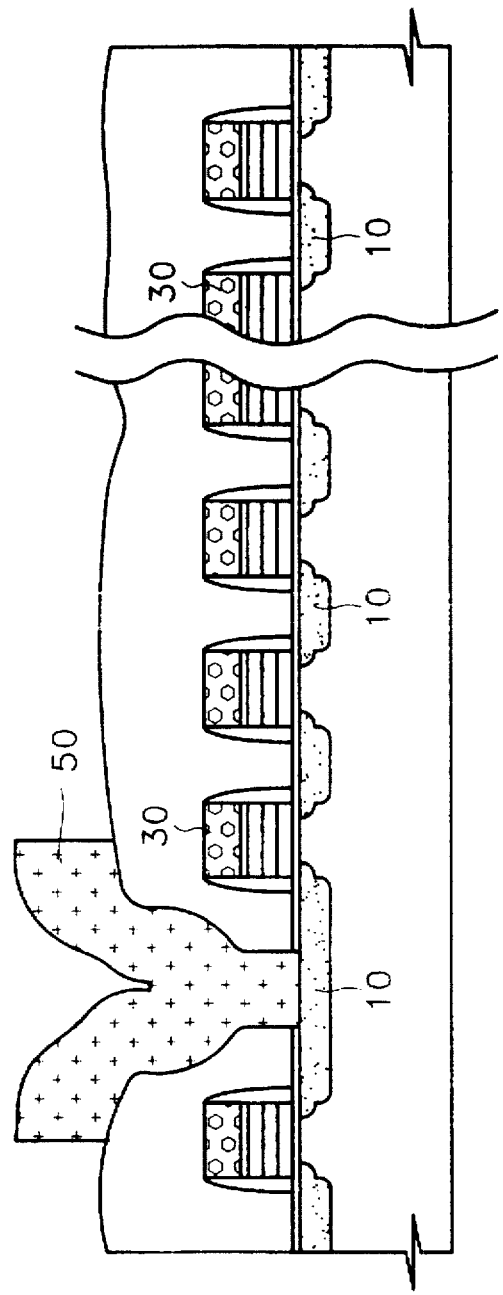
FIG. 3 is a section view taken along line a—a' of FIG. 2.
Figure 4:
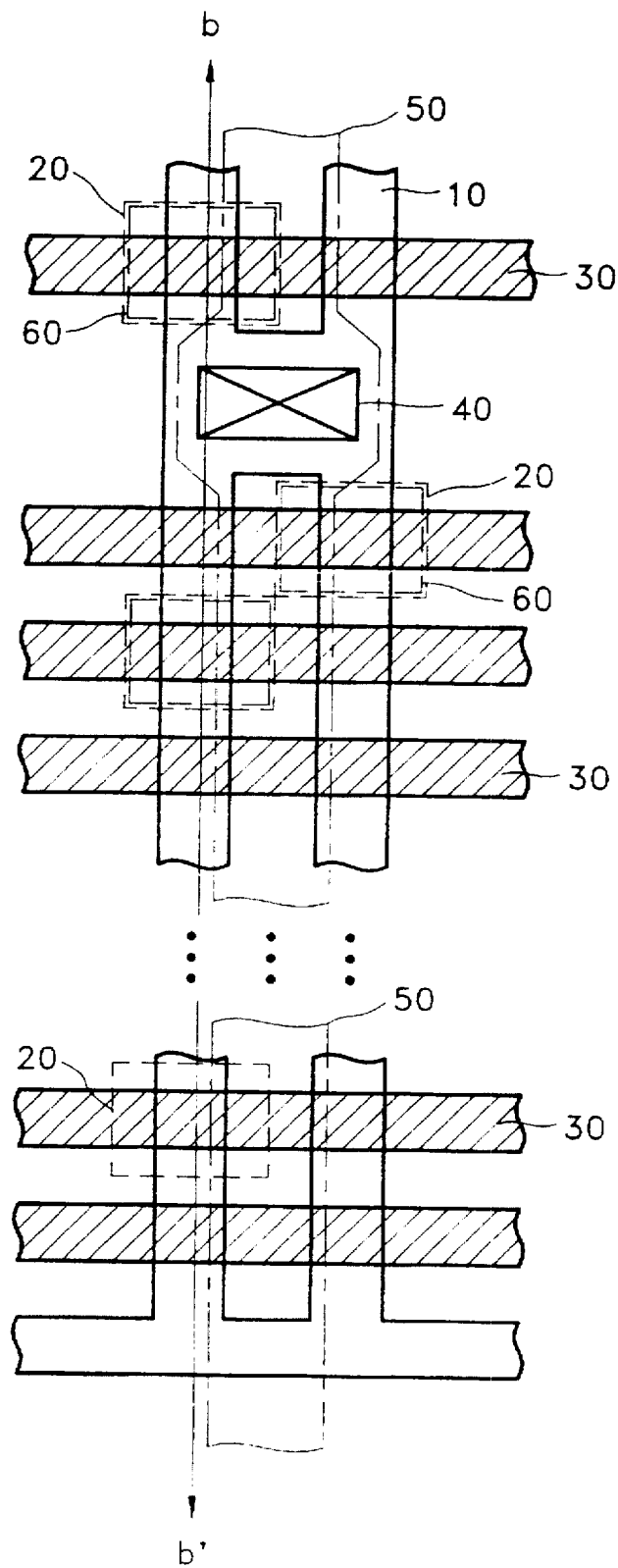
FIG. 4 is a plan view of a NAND type non-volatile memory device according to one embodiment of the present invention.
Figure 5:
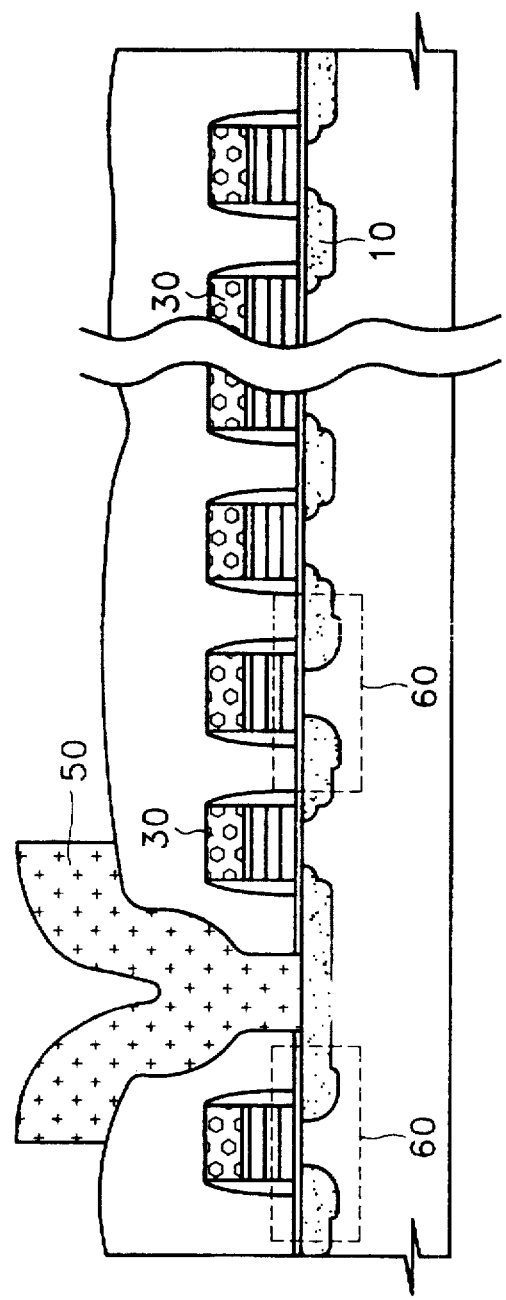
FIG. 5 is a section view taken along line b—b' of FIG. 4.

FIGS. 4 and 5 show the structure of a mask ROM according to one embodiment of the present invention. Here, FIG. 4 is a plan view, and FIG. 5 is a cross-sectional view taken along line b—b' of FIG. 4. To facilitate explanation, the same reference designations as the prior art are allotted to the corresponding portions of the present invention and thus explanation thereof will be omitted.

As shown in FIGS. 4 and 5, for transistors included in the mask ROM, high concentration ion-implanting region 60, of a predetermined conductivity for improving the cell current inside depletion type ion-implanting region 20 for limiting the channel region, is superimposed on the source and drain regions by a predetermined interval. Namely, after an ion-implanting process for forming an N+ source/drain region is performed, the same mask and same conductive type impurities as used for forming depletion type ion-implanting region 20 are used to additionally implant the impurity ions only to the depletion type transistor for string selecting so that N+ ion-implanting region 60 for current increase is formed.

Accordingly, the junction depth of the source/drain region of the depletion type transistor for string selection is greater than that of other corresponding transistors and thus the driving capability of the whole current of the semiconductor memory element is improved. Moreover, by greatly inducing lateral diffusion, the effective channel length becomes shorter so that the current driving capability increases and high integration can be realized.

At this time, an ion-implanting condition for forming ion-implanting region 60 for a cell current increase is similar to that for forming depletion type ion-implanting region 20. For example, depletion ion-implanting region 20 is formed by implanting arsenic (As) ions in a dose quantity of about $2\sim5\times10^{15}/cm^2$ with an acceleration energy of 40 KeV into region 20, and ion-implanting region 60 for cell current increase is formed by implanting phosphorus (P) ions in a dose quantity of about $1\sim3\times10^{15}/cm^2$ with an acceleration energy of 80 Kev into region 60. After the arsenic ions and the phosphorus ions are implanted into region 20 and region 60, respectively, a thermal treatment process is performed at the temperature of 950° C. under a nitrogen ($N_2$) atmosphere, thereby resulting in the formation of depletion type ion-implanting region 20 and ion-implanting region 60 for cell current increase.

Figure 6:
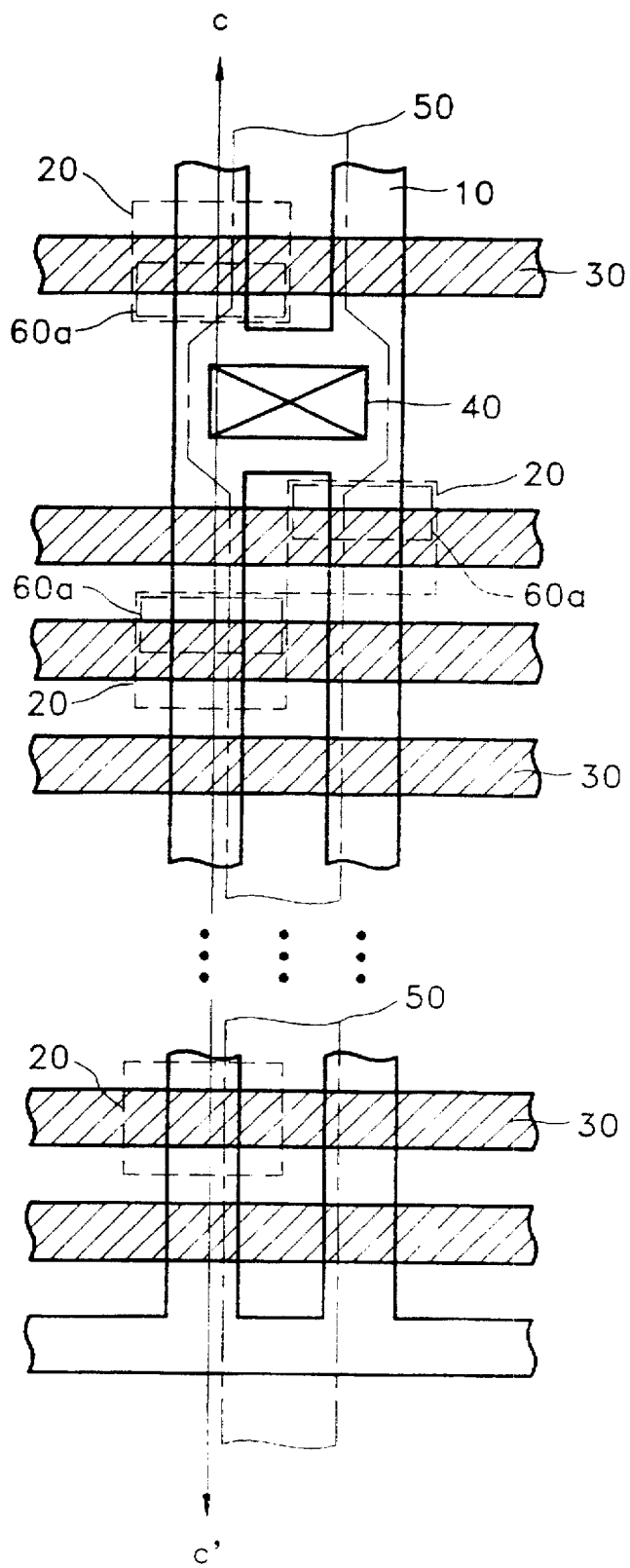
FIG. 6 is a plan view of a NAND type non-volatile memory device according to another embodiment of the present invention.
Figure 7:
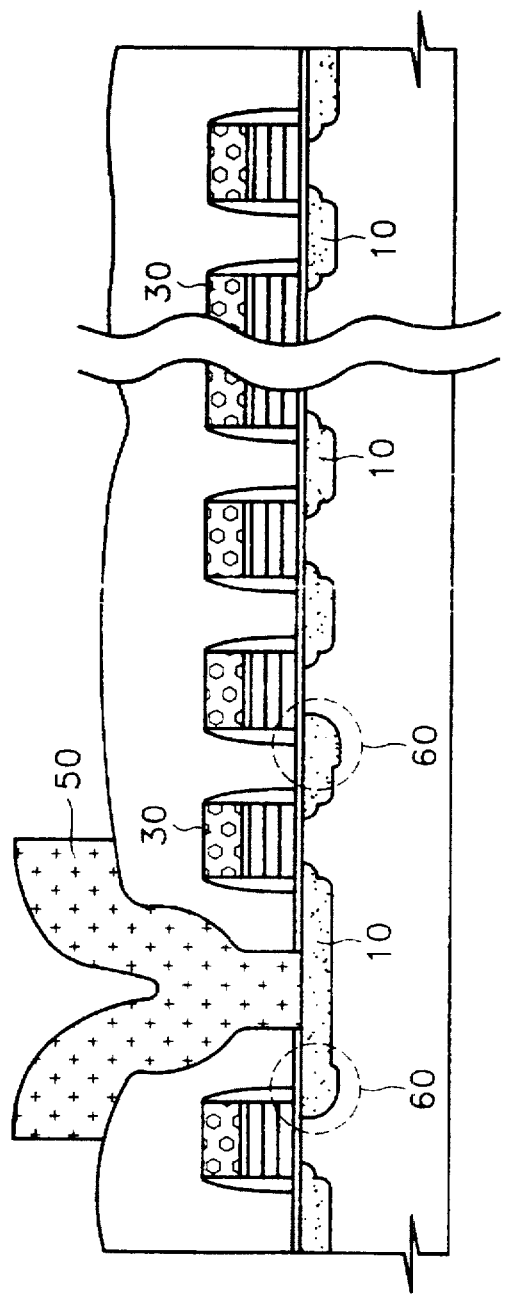
FIG. 7 is a section view taken along line c—c' of FIG. 6.

FIGS. 6 and 7 show the structure of a NAND type mask ROM in accordance with another embodiment of the present invention, wherein FIG. 6 is a plan view and FIG. 7 is a cross-sectional view taken along line c—c' of FIG. 6.

The point which is different from the first embodiment is that an ion-implanting region 60a for current increase is formed only in the drain region of the depletion type transistor for string selection. Namely, the junction depth of the drain region of the depletion type transistor for string selection is greater than those in source and drain regions of other transistors and the source region of the transistor for string selection.

Accordingly, while the current driving capability is increased by reducing the effective channel length of the depletion type transistor for string selection ions for forming ion-implanting region 60a for cell current increase are not implanted into the junction portion of an adjacent enhancement type transistor for string selection and transistors for data recording. Therefore, deterioration of the punch-through characteristic caused by mask misalignment during photolithography processess or serious lateral diffusion, during thermal treatment processess, can be prevented.

As described above, according to the NAND type mask ROM of the present invention, the ion-implanting region for current increase is formed in the source and drain region (or only in the drain region) of the depletion type transistor for string selection, so that the junction depth of the source and drain of the depletion type transistor for string selection is greater than those of the source and drain of other transistors and thus the current driving capability can be improved.

What is claimed is:

1. A NAND type non-volatile memory comprising:
   a series circuit including:
      a plurality of data memory cells comprised of serially connected transistors; and
      a plurality of serially connected depletion-type and enhancement-type transistors for string selection in order to select a specific cell among said plurality of data memory cells;
   wherein an ion-implanting region is formed in source and drain regions of the depletion-type transistor for string selection, and a junction depth of the source and drain regions of the depletion type transistor for string selection is greater than those of the sources and drains of said enhancement-type transistors and said transistors of said data memory cells.

2. A NAND type non-volatile memory according to claim 1, wherein said ion-implanting regions are implanted with one selected from the group consisting of phosphorus and arsenic ions.

3. A NAND type non-volatile memory comprising:
   a serial circuit including:
      a plurality of cells for data memory comprised of serially connected depletion-type and enhancement-type transistors; and
      a plurality of serially connected depletion-type and enhancement-type transistors for string selection in order to select one specific cell among the cells;
   wherein an ion-implanting region is formed only in a drain region of said depletion-type transistor for string selection, and a junction depth of the drain region of the depletion-type transistor for string selection that is greater than those of the sources and drains of said enhancement-type transistors for string selection and said transistors of said data memory.

4. A NAND type non-volatile memory according to claim 3, wherein said ion-implanting regions are implanted with one selected from the group consisting of phosphorus and arsenic ions.

* * * * *